United States Patent
Kok et al.

(10) Patent No.: US 8,013,977 B2
(45) Date of Patent: Sep. 6, 2011

(54) LITHOGRAPHIC APPARATUS, RADIATION SENSOR AND METHOD OF MANUFACTURING A RADIATION SENSOR

(75) Inventors: Haico Victor Kok, Eindhoven (NL); Arie Johan Van Der Sijs, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 763 days.

(21) Appl. No.: 11/487,607

(22) Filed: Jul. 17, 2006

(65) Prior Publication Data

US 2008/0013059 A1    Jan. 17, 2008

(51) Int. Cl.
*G03B 27/42* (2006.01)

(52) U.S. Cl. .................. 355/53; 355/30; 250/368

(58) Field of Classification Search .......... 355/53, 355/30; 250/368
See application file for complete search history.

(56) References Cited

U.S. PATENT DOCUMENTS

| | | | |
|---|---|---|---|
| 4,910,405 A * | 3/1990 | Suzuki et al. | ........... 250/368 |
| 5,420,959 A | 5/1995 | Walker et al. | |
| 5,998,802 A | 12/1999 | Struye et al. | |
| 6,947,459 B2 | 9/2005 | Kurtz et al. | |
| 2004/0251420 A1 | 12/2004 | Sun | |
| 2005/0078287 A1 | 4/2005 | Sengers et al. | |
| 2006/0192093 A1* | 8/2006 | Kok et al. | ........... 250/234 |

FOREIGN PATENT DOCUMENTS

| | | |
|---|---|---|
| JP | 02291506 A | 3/1990 |
| JP | 10173861 A | 6/1998 |
| JP | 2003524175 T | 8/2003 |
| JP | 2005079587 A | 3/2005 |
| JP | 06174949 A | 7/2006 |
| JP | 2006181849 A | 7/2006 |
| JP | 2008542799 T | 11/2008 |

OTHER PUBLICATIONS

Office Action in related Japanese Application No. 2007-180592 mailed Aug. 2, 2010.
Office Action in related Japanese application No. 2007-180592 mailed Mar. 3, 2011.

* cited by examiner

*Primary Examiner* — Edward J Glick
*Assistant Examiner* — Mesfin T Asfaw
(74) *Attorney, Agent, or Firm* — Pillsbury Winthrop Shaw Pittman LLP

(57) ABSTRACT

A radiation sensor includes a radiation receiver positioned in a focal plane of the final element of the projection system; a transmissive plate supporting the radiation receiver at a side facing the projection system; a quantum conversion layer to absorb light at the first wavelength incident on the transmissive plate and reradiate light at a second wavelength; a fiber optics block with a plurality of optical fibers; and a radiation detector. In the radiation sensor, the plurality of optical fibers guide light is reradiated by the quantum conversion layer towards the radiation detector. The radiation sensor can be used as a substrate-level sensor in a lithographic apparatus.

25 Claims, 5 Drawing Sheets

LITHOGRAPHIC APPARATUS, RADIATION SENSOR AND METHOD OF MANUFACTURING A RADIATION SENSOR

BACKGROUND OF THE INVENTION

1. Field of the Invention

The present invention relates to a lithographic apparatus and device manufacturing method using such a lithographic apparatus. The invention further relates to a radiation sensor for use in a lithographic apparatus, a lithographic apparatus comprising such a radiation sensor, and a device manufacturing method using such a lithographic apparatus. The invention further relates to a method of manufacturing a radiation sensor.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. This enables imaging of smaller features.

A number of sensors are typically used at substrate level for evaluating and optimizing imaging performance. These may include an integrated lens interferometer at scanner, i.e. ILIAS. The ILIAS is an interferometric wavefront measurement system that may perform static measurements on lens aberrations up to a high order. It comprises a source module and a sensor module.

The source module may comprise a patterned layer of chromium that is placed in an object plane of a projection system of the lithographic apparatus and may have additional optics provided above the chromium layer. The source module of ILIAS provides a wavefront of radiation to the entire pupil of the projection system.

The sensor module may comprise a patterned layer of chromium, which is placed in an image plane of the projection system, and a camera that is placed some distance behind the layer of chromium. The patterned layer of chromium of the sensor module diffracts incident radiation into several diffraction orders that interfere with each other giving rise to a interferogram. The interferogram is measured by the camera. Aberrations in the projection system may then be determined by software based upon the interferogram as measured with the camera.

The ILIAS may be implemented as an integrated measurement system used for system initialization and calibration. Alternatively, it may be used for monitoring and recalibration "on-demand". A conventional ILIAS is not optimized for use in systems with high numerical aperture (NA), i.e. a liquid immersion system.

SUMMARY OF THE INVENTION

It is desirable to provide a lithographic apparatus comprising a sensor at substrate level with high sensitivity that is suitable for use in a high NA system.

In an embodiment, s a lithographic apparatus comprises an illumination system configured to condition a radiation beam at a first wavelength; a support configured to support a patterning device, the patterning device being configured to impart the radiation beam with a pattern in its cross-section to form a patterned radiation beam at the first wavelength; a substrate table configured to hold a substrate; a projection system configured to project the patterned radiation beam onto a target portion of the substrate, the projection system comprising a final element; and a substrate-level sensor comprising a radiation receiver positioned in a focal plane of the final element of the projection system, a transmissive plate supporting the radiation receiver at a side facing the projection system, a quantum conversion layer arranged to absorb light at a first wavelength incident on the transmissive plate and reradiate light at a second wavelength, a fiber optics block comprising a plurality of optical fibers and a radiation detector, wherein the plurality of optical fibers is arranged to guide light reradiated by the quantum conversion layer towards the radiation detector.

In another embodiment, a device manufacturing method comprises transferring a pattern from a patterning device onto a substrate using such a lithographic apparatus.

In still another embodiment, a radiation sensor comprises a radiation receiver arranged to receive incident radiation; a transmissive plate supporting the radiation receiver at a first side; a quantum conversion layer arranged to absorb light at a first wavelength incident on the transmissive plate and reradiate light at a second wavelength; a fiber optics block comprising a plurality of optical fibers arranged to collect and guide light reradiated by the quantum conversion layer; and a radiation detector arranged to receive radiation guided by the plurality of optical fibers.

In a further embodiment, a lithographic apparatus comprises an illumination system configured to condition a radiation beam; a support configured to support a patterning device, the patterning device being configured to impart the radiation beam with a pattern in its cross-section to form a patterned radiation beam; a substrate table configured to hold a substrate; and a projection system configured to project the patterned radiation beam onto a target portion of the substrate, wherein the lithographic apparatus further comprises a such a radiation sensor.

In yet another embodiment, a device manufacturing method comprises transferring a pattern from a patterning device onto a substrate using such a lithographic apparatus.

In an even further embodiment, a method of manufacturing a radiation sensor comprises providing a fiber optics block, the fiber optics block comprising a plurality of optical fibers; forming a structure by connecting the fiber optics block with a block of quantum conversion material, the structure having a first end arranged for connection with the plurality of optical fibers and a second end arranged for connection with the quantum conversion material; reducing the volume of the structure at the second end as to form a fiber optics block provided with a quantum conversion layer; providing a transmissive plate; connecting the transmissive plate with the second end of the structure; providing a radiation detector; positioning the radiation detector in close proximity of the first end of the structure.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
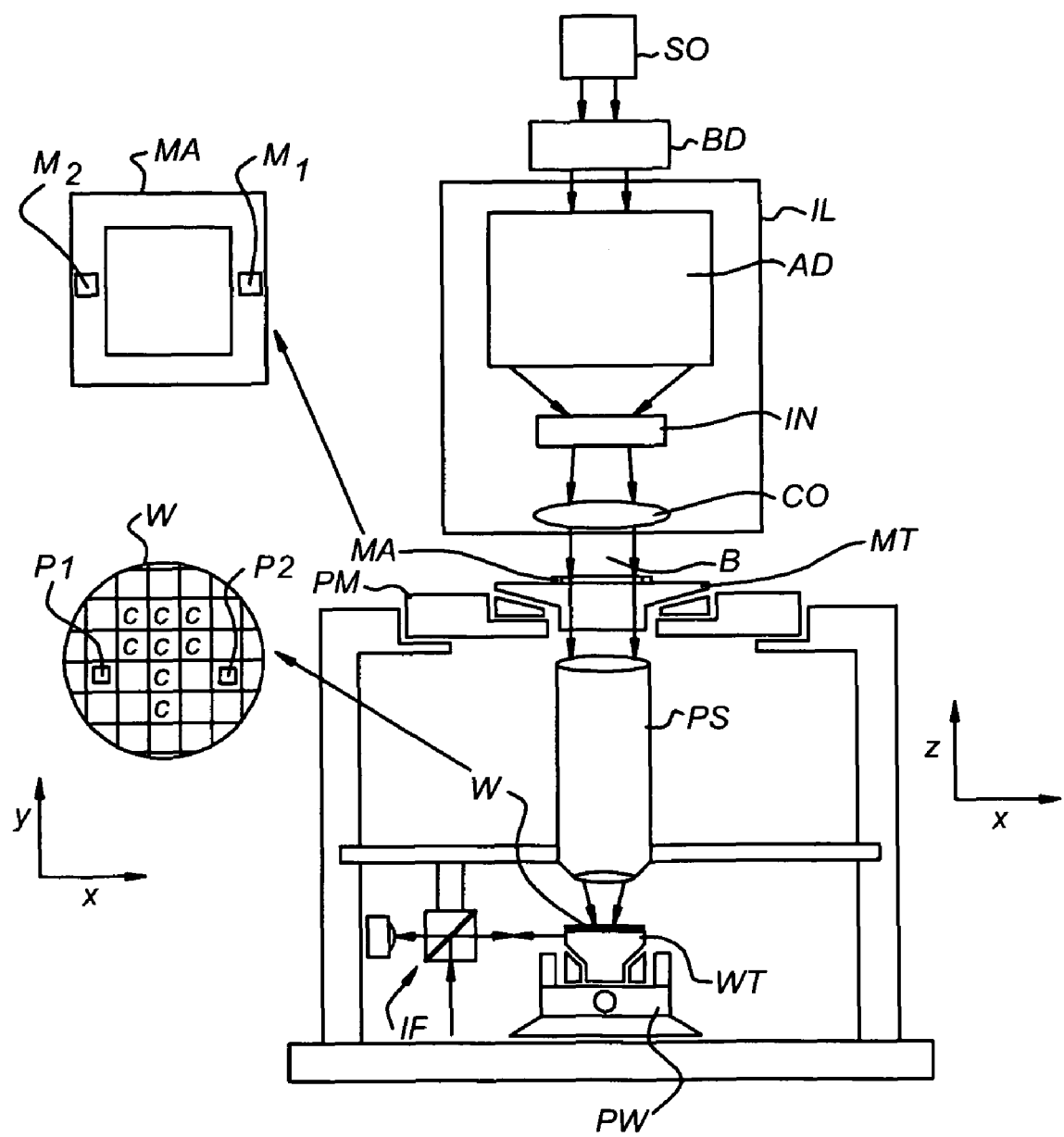
FIG. 1 depicts a lithographic apparatus according to an embodiment of the invention.

FIG. 1 depicts a lithographic apparatus according to one embodiment of the invention. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PS is configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of an exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of an exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Embodiments of the invention are explained with respect to a substrate-level sensor, i.e. integrated lens interferometer at scanner (ILIAS), that is used in a lithographic apparatus, e.g. the lithographic apparatus depicted in FIG. 1. This does not mean that embodiments of the invention are limited to substrate-level sensors. Embodiments of the invention may also relate to radiation sensors in general, e.g. a radiation sensor arranged to measure properties of the illumination system IL.

Figure 2:
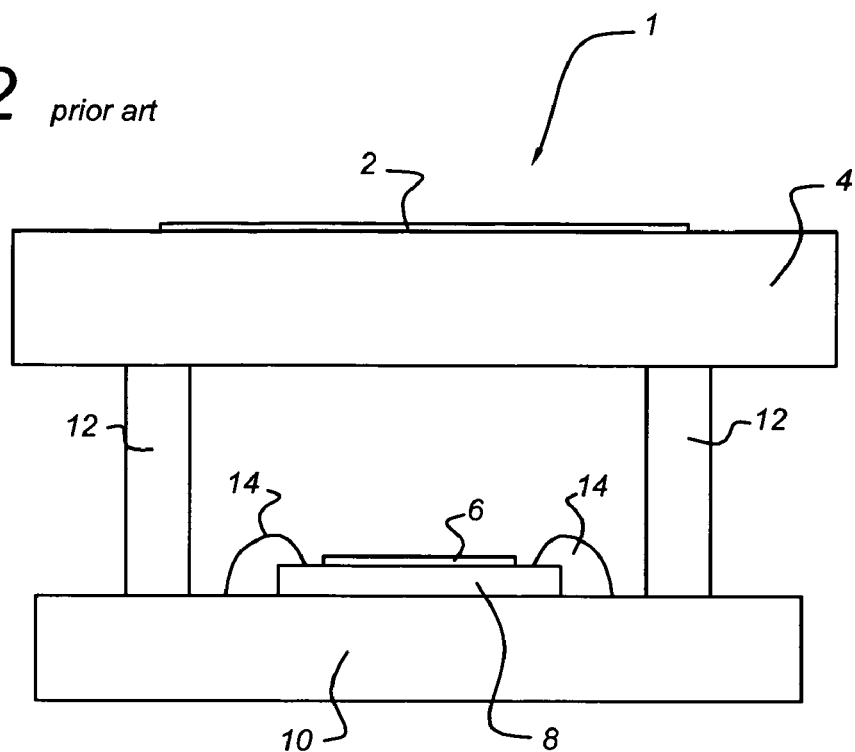
FIG. 2 depicts an embodiment of an ILIAS as known in the art.
Figure 3:
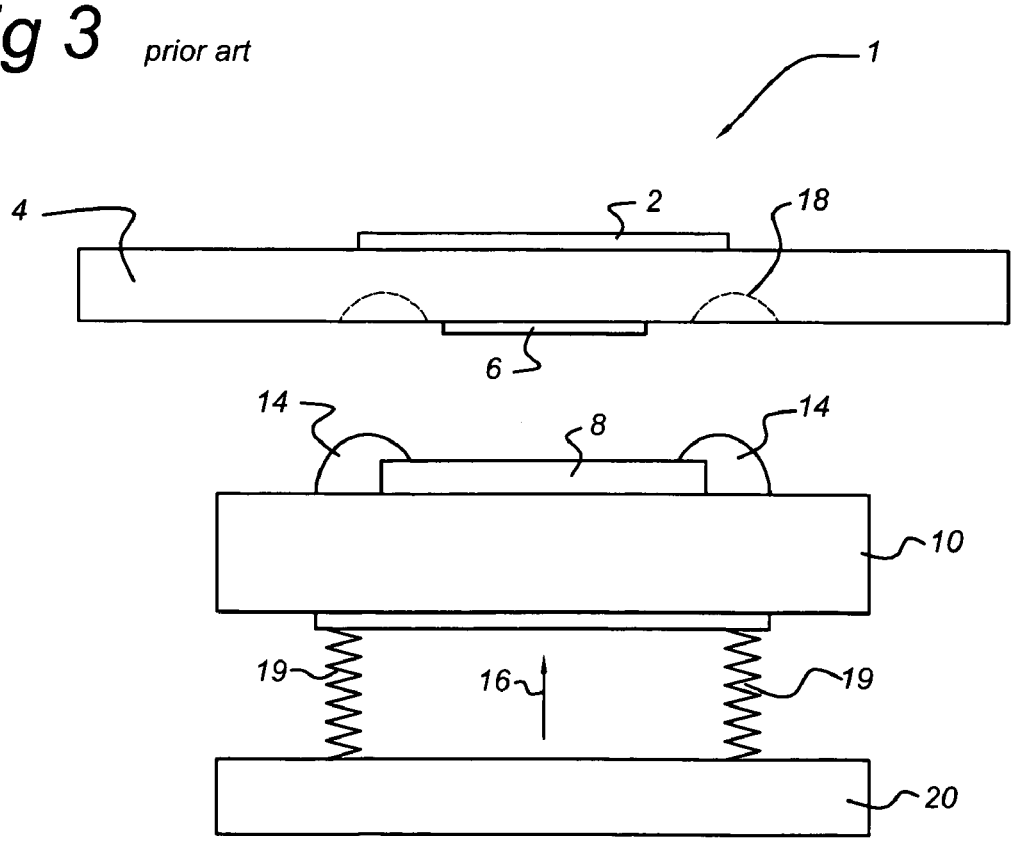
FIG. 3 depicts another embodiment of an ILIAS as known in the art.

FIGS. 2 and 3 schematically depict an embodiment of an ILIAS as known in the state of the art.

FIGS. 4a, 4b and 5a, 5b depict embodiments of substrate-level sensors according to the present invention. All substrate-level sensors described in this document comprise a radiation receiver and a radiation detector. The radiation receiver, which may be a layer with a pinhole, a grating or another diffractive element fulfilling a similar function, may be supported on top of a sensor body, i.e. a quartz sensor body. The radiation receiver is generally arranged at a side of the body facing the projection system. The radiation detector may be arranged within the sensor body, or within a region formed on the other side of the sensor body, i.e. the side facing away from the projection system.

At boundaries between media of different refractive indices, a proportion of incident radiation will be reflected and potentially lost from the sensor. For optically smooth surfaces, the extent to which this occurs depends on the angle of incidence of the radiation and the difference in refractive index of the media in question. For radiation incident at and above a "critical angle", generally measured from normal incidence, total internal reflections may occur, leading to serious loss of signal to later elements of the sensor. This may increase in high NA systems where radiation may have a higher average angle of incidence.

In addition to losses due to partial and total internal reflection, absorption may also reduce radiation intensity reaching the sensor. Scattering from interfaces that are not optically smooth may also play a role in reducing aforementioned radiation intensity.

In embodiments of a substrate-level sensor according to the present invention, exposure radiation may be directed from the final element of the projection system through an immersion liquid at least partly filling a space between the final element of the projection system and the substrate W. The detailed configuration of each of these elements depends on the properties of the radiation to be detected.

FIG. 2 schematically depicts a first embodiment of an ILIAS 1 as known in the art. This ILIAS 1, which is generally used in conjunction with a projection system with a numerical aperture (NA) smaller than 1, comprises a shearing grating structure 2 or the like as radiation receiver. The shearing grating structure 2 or the like is supported by a transmissive plate 4, e.g. a glass or quartz plate. A quantum conversion layer 6, e.g. a layer comprising phosphor, is positioned immediately above a radiation detector 8, i.e. a camera or camera chip. The radiation detector 8 is mounted on a substrate 10, which is connected to the transmissive plate 4 via spacers 12. Bonding wires 14 connect the radiation detector 8 to external instrumentation, that are arranged to receive signals comprising data with respect to the radiation detected and process these signals for further analysis.

The quantum conversion layer 6 is arranged to absorb radiation of a first wavelength, e.g. deep ultraviolet (DUV) radiation, and to reradiate a short time later at a second wavelength. The quantum conversion layer 6 may have a thickness of about 5-25 μm. The radiation detector 8 is sensitive to the reradiated radiation at the second wavelength.

A gas gap is located between the quantum conversion layer 6 and the transmissive plate 4. Due to the presence of the gas gap, light with an NA >1 is prevented from leaving the transmissive plate leading to a loss of light as it will not reach the radiation detector 8.

Generally, the radiation sensor, i.e. ILIAS 1, is placed near the projection system in order to measure its properties. In an embodiment, the radiation receiver of the radiation sensor, i.e. ILIAS 1, is positioned in a focal plane of the projection system. Generally, the focal plane is close to the projection system itself. The radiation sensor, i.e. ILIAS 1, provides a thermal load on its environment. The thermal load is carried away by an immersion liquid (in immersion systems or the like) or an air flow (in systems without an immersion liquid). However, since the refractive index of gases like air and immersion liquids like water are temperature dependent, the heat load may cause disturbances on the measurement of lens aberrations, e.g. lens aberrations of elements within the projection system. Consequently, to limit its heat generation, the radiation sensor may be limited in its performance.

FIG. 3 schematically depicts a second embodiment of an ILIAS 1 as known in the art. This embodiment of the ILIAS 1 is generally used in conjunction with a projection system with a NA larger than 1, e.g. as used in an immersion lithographic projection apparatus or the like. Again, the sensor 1 comprises a shearing grating structure 2 or the like as a radiation receiver. The shearing grating structure 2 or the like is supported by a transmissive plate 4, e.g. a glass or quartz plate, at a side facing the projection system.

Due to the high NA, however, light entering the transmissive plate 4 may have difficulties leaving. The angles of incidence may be so high that they cause internal reflections to occur regularly. Therefore, a quantum conversion layer 6 is provided on the transmissive plate 4 at a side facing away from the projection system. In the conversion layer 6, e.g. made of a luminescent glass, e.g. a glass doped with rare-earth ions, and having a thickness of about 5-25 μm, the converted light is reradiated in all directions. To minimize light losses and loss of image resolution, the radiation detector 8 is positioned in close proximity to the quantum conversion layer 6 by pressing the radiation detector against the quantum conversion layer 6 with pressure-producing device 20 comprising one or more springs 19 or the like. In FIG. 3, the direction of the applied force is schematically depicted by arrow 16.

Because the radiation detector 8 and the quantum conversion layer 6 of luminescent material generally suffer from a certain degree of unflatness or roughness, the radiation detector 8 may touch the quantum conversion layer 6 at some places, while at other places such a contact may not be established. The resulting difference in contact pressure may cause hot spots, i.e. spots that receive more light, in an image obtained by the radiation detector 8.

Additionally, in order to connect the radiation detector 8 to external instrumentation, enough space needs to be available for one or more bonding wires 14. Currently, one or more grooves 18 are made in the transmissive plate 4 for this purpose.

Figure 4A:
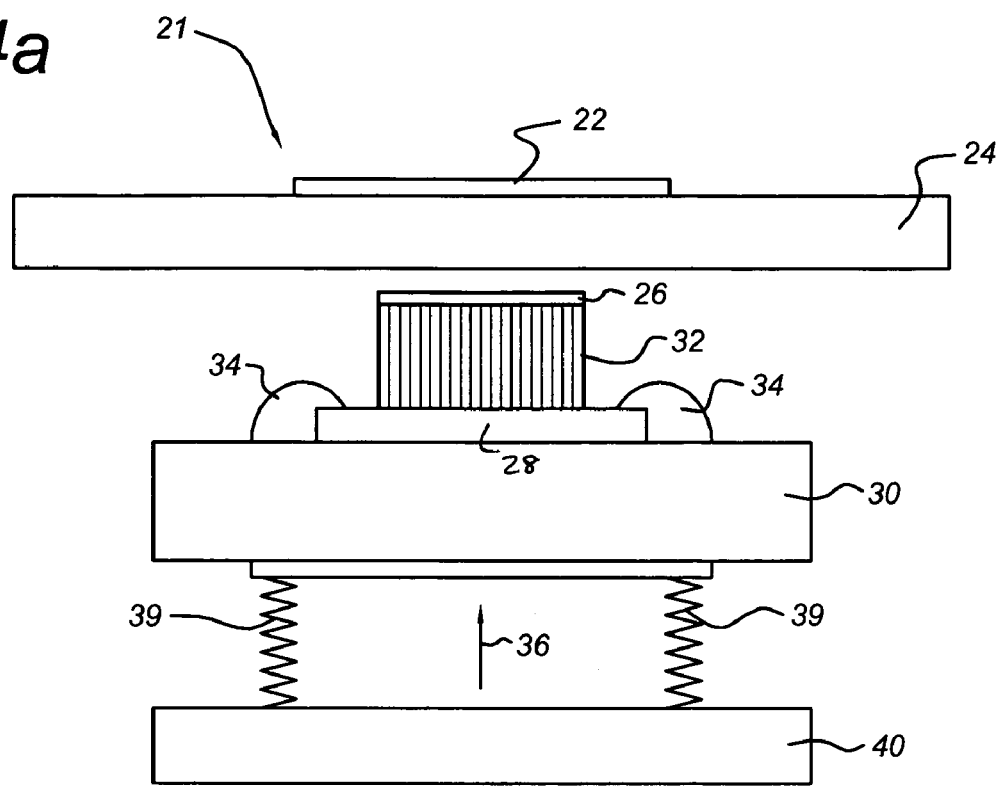
FIG. 4a depicts a substrate-level sensor according to an embodiment of the invention.
Figure 4B:
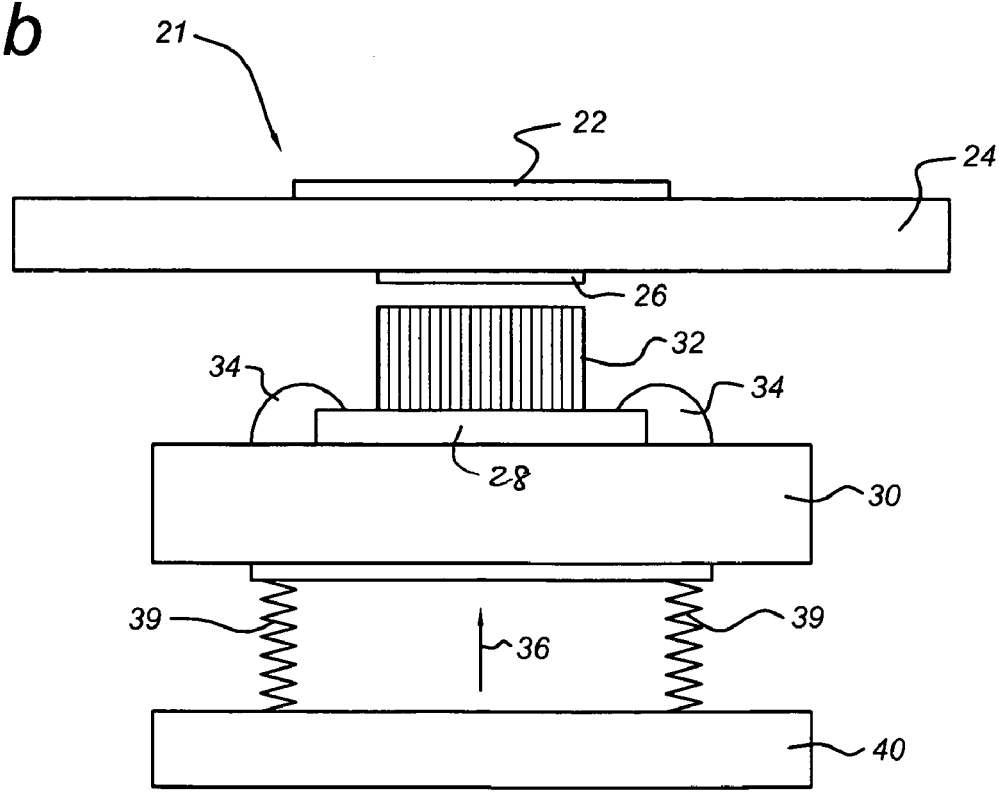
FIG. 4b depicts a substrate-level sensor according to an embodiment of the invention.

FIGS. 4*a* and 4*b* schematically depict a substrate-level sensor 21 according to embodiments of the invention. In both figures, the substrate-level sensor 21 comprises a radiation receiver 22, e.g. a shearing grating structure or pinhole structure, supported by a transmissive plate 24, e.g. a glass or quartz plate, and a radiation detector 28, e.g. a camera like a CCD-camera. The radiation detector 28 may be mounted on a substrate 30. The radiation detector 28 may further be connected to external instrumentation via bonding wires 34. On top of the radiation detector 28, at the side of the transmissive plate 24, a fiber optics block 32 is mounted. Between the fiber optics block 32 and the transmissive plate 24, a quantum conversion layer 26, e.g. comprising a luminescent glass, is either provided on the fiber optics block 32 at its side facing the transmissive plate 24 (FIG. 4*a*) or, alternatively, provided on the transmissive plate 24 at its side facing the fiber optics block 32 (FIG. 4*b*). In an embodiment, the quantum conversion layer 26 has a thickness that is at least five times larger than an absorption length in the quantum conversion layer 26 of the incident radiation with a first wavelength, e.g. DUV-radiation, and at least 50 times smaller than the thickness of the transmissive plate 24. Generally, these boundaries lead to a thickness of about 5-25 μm. The fiber optics block 32 comprises a plurality of optical fibers arranged to guide light reradiated by the quantum conversion layer 26 towards the radiation detector 28. A pre-stressed force generated by a pressure-producing device 40 may provide contact between the fiber optics block 32, the quantum conversion layer 26 and the transmissive plate 24 to preserve image resolution. The direction of the pre-stressed force that is applied, e.g. by using one or more springs 39 or the like, is schematically depicted by arrow 36.

Figure 5A:
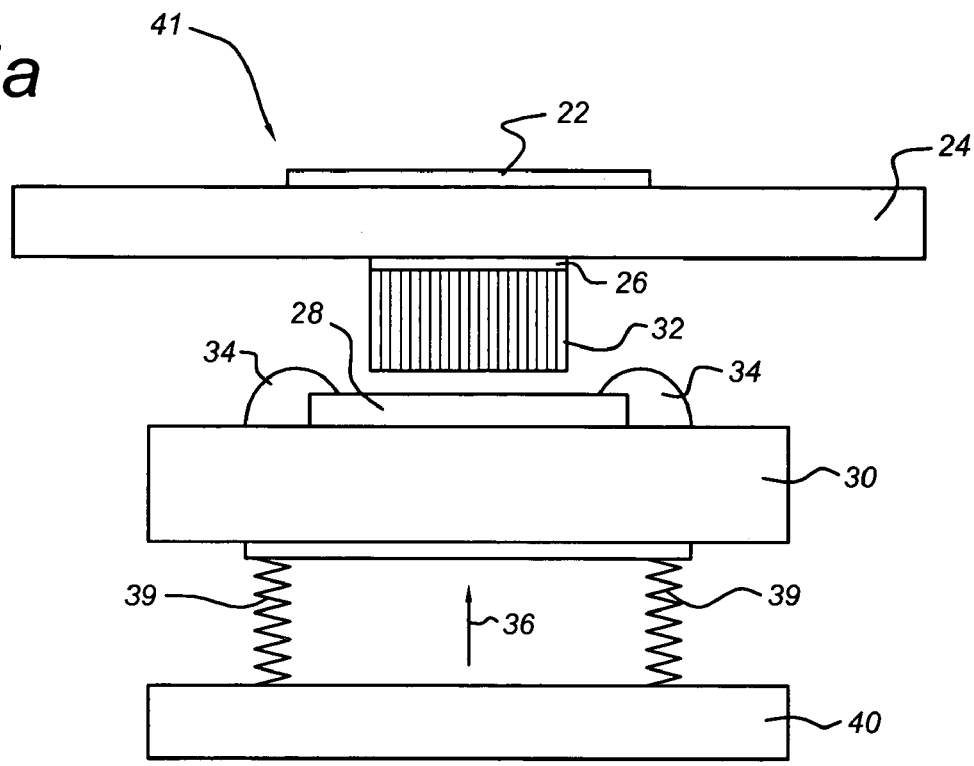
FIG. 5a depicts a substrate-level sensor according to an embodiment of the invention.
Figure 5B:
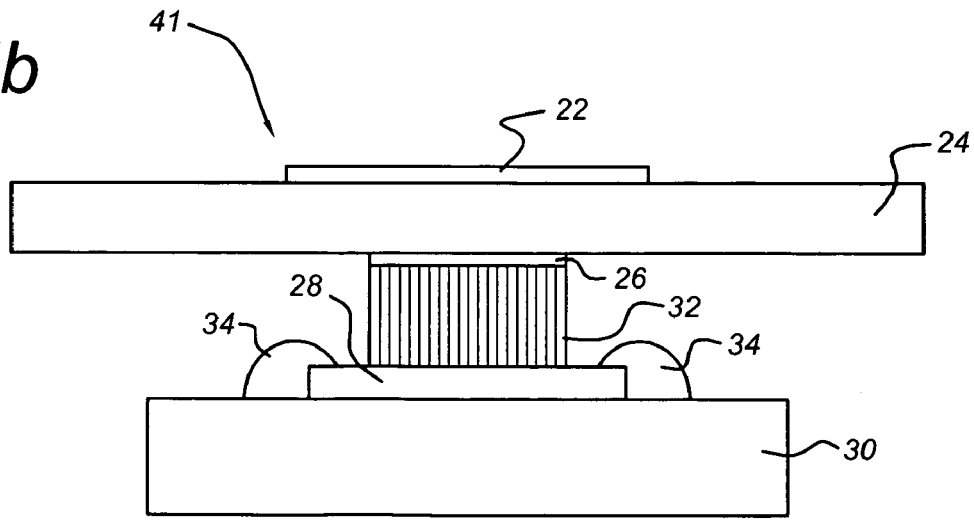
FIG. 5b depicts a substrate-level sensor according to an embodiment of the invention.

FIGS. 5*a*, 5*b* schematically depict a substrate-level sensor 41 according to embodiments of the invention. In contrast to embodiments of the substrate-level sensor 21 depicted in FIGS. 4*a* and 4*b*, in these embodiments, the quantum conversion layer 26 and the fiber optics block 32 are mounted on the transmissive plate 24, e.g. by direct contacting. The radiation detector 28, e.g. a camera, may again be pressed against the fiber optics block 32 with a pre-stressed force, e.g. by using a pressure-producing device 40 comprising one or more springs 39 or the like as is depicted in FIG. 5*a*. The pre-stressed force that is applied, is again schematically depicted by arrow 36. Alternatively, as is depicted in FIG. 5*b*, the radiation detector 28 may be connected to the fiber optics block 32, e.g. by using an optical glue or the like.

In embodiments of the invention, the fiber optics block 32 comprises a plurality of fibers with an absorbing material between the fibers. The absorbing material is arranged to absorb radiation coming from the quantum conversion layer that falls outside the NA of the fiber optics block 32. Consequently, less stray light may reach the radiation detector 28.

In embodiments of ILIAS as schematically depicted in FIG. 3, the quantum conversion layer 6 may be glued to the transmissive plate 4 with an optical glue. Due to the radiation, incident on the transmissive plate 4, i.e. DUV-radiation, the optical glue may degrade over time. This may lead to a poor contact in the long term. In embodiments of a substrate-level sensor according to the invention on the other hand, the quantum conversion layer 6, i.e. made of a luminescent glass or the like, may be glued on the fiber optics block 32 instead with an optical glue. As the quantum conversion layer reradiates light with a different wavelength, i.e. 480-550 nm, the optical glue will degrade to a lesser degree, and the contact remains intact for a longer period of time.

In embodiments of a substrate-level sensor according to the invention as can be readily seen in the embodiments schematically depicted in FIGS. 4a, 4b, 5a and 5b, the radiation detector 28 does not directly contact the quantum conversion layer 26. Consequently, hot spots due to variable contact between these two structures are not present.

Additionally, due to fiber optics block 32, there may be enough space to connect the radiation detector 28 to external instrumentation via bonding wires 34 without adapting the transmissive plate 24 for that purpose, e.g. by making one or more grooves. Consequently, the structural integrity of the transmissive plate 24 may increase.

The fiber optics block 32 itself, if large enough, may also provide additional structural integrity. To maintain a certain transmittance without light loss, an increase of the NA of the projection system PS will generally lead to a decrease of the thickness of the transmissive plate 24. However, its performance will degrade gradually with aforementioned decrease below a certain thickness, i.e. generally a few millimeters, due to insufficient structural integrity of the transmissive plate 24. The fiber optics block 32, for example in the embodiment depicted in FIGS. 5a and 5b, may increase the threshold thickness as it may contribute to the structural integrity of the structure as a whole, i.e. the transmissive plate 24 combined with the fiber optics block 32 provided with the quantum conversion layer 26.

Figure 6:
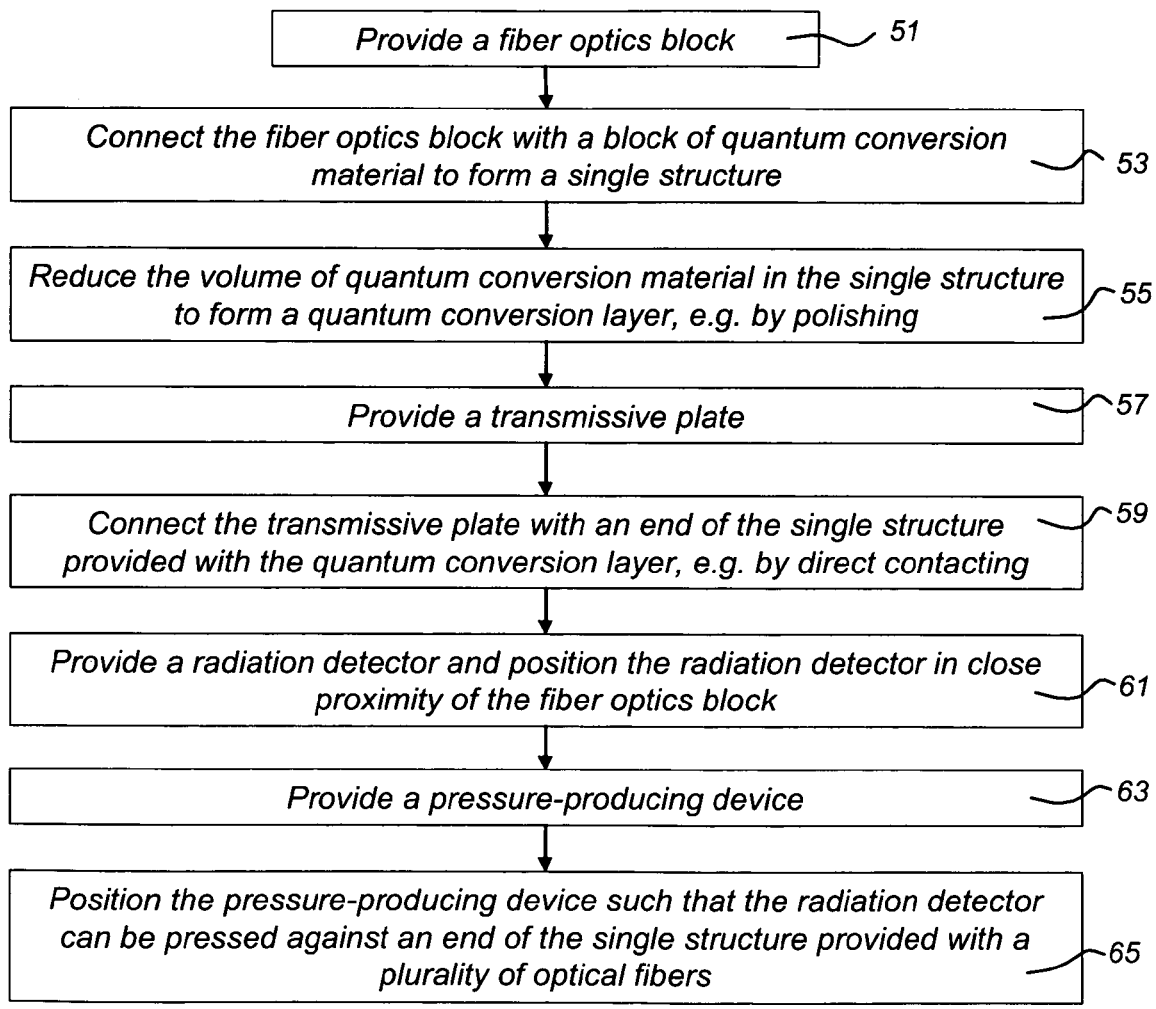
FIG. 6 depicts a flow chart of an embodiment of a method of manufacturing the substrate-level sensors as depicted in FIGS. 5a and 5b.

FIG. 6 schematically depicts a flow chart of an embodiment of a method of manufacturing the substrate-level sensor as depicted in FIGS. 5a and 5b. In action 51, a fiber optics block is provided. The fiber optics block comprises a plurality of optical fibers.

In action 53, the fiber optics block is at one side connected with a block of quantum conversion material, e.g. a luminescent glass. The connection, resulting in the formation of a single structure with the plurality of optical fibers at one end and quantum conversion material at another end, may be formed by using an optical glue.

In action 55, the volume of quantum conversion material in the structure is reduced, e.g. by polishing, to form a quantum conversion layer on top of the fiber optics block. Polishing in this context may include mechanical polishing and/or chemical polishing. A suitable thickness of the quantum conversion layer is at least five times larger than an absorption length of light of a certain wavelength in the quantum conversion layer. For deep UV wavelengths (DUV) generally a thickness of 5-25 µm is suitable.

In action 57, a transmissive plate, e.g. a glass or quartz plate, is provided. In action 59, the transmissive plate is connected with the single structure at the end with the quantum conversion layer as formed in action 55. Such a connection may be established by direct contacting. Among others, direct contacting includes techniques in which local thermal heating during a short period of time results in a direct contact between two structures, and techniques in which smooth and clean surfaces are brought into contact with each other, after which Van der Waals forces bond the two surfaces together.

In action 61 and a radiation detector is provided and position in close proximity of the fiber optics block. In an embodiment, this is established by connecting both the radiation detector and the fiber optics block to an external frame and align them by using the frame as a common reference.

Alternatively, which leads to the embodiment depicted in FIG. 5a, the method may continue, in action 63, with providing a pressure-producing device, e.g. a spring or the like. In that case, in action 65, the pressure-producing device is positioned in such a way that the radiation detector can be pressed against the end of the single structure provided with the plurality of optical fibers.

In yet another alternative embodiment of the method, leading to the embodiment of a sensor as depicted in FIG. 5b, after positioning the radiation detector in close proximity of the fiber optics block in action 61, the radiation detector may be connected to the fiber optics block, e.g. by using an optical glue or the like.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it should be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

The invention claimed is:
1. A lithographic apparatus, comprising:
a support configured to support a patterning device, the patterning device being configured to provide a radiation beam at a first wavelength with a pattern in the cross-section of the radiation beam to form a patterned radiation beam at the first wavelength;

a substrate table configured to hold a substrate;
a projection system configured to project the patterned radiation beam onto a target portion of the substrate, the projection system comprising a final element; and
a substrate-level sensor comprising
 a radiation receiver positioned in, or positionable into, a focal plane of the final element;
 a transmissive plate configured to support the radiation receiver at a side facing the projection system;
 a quantum conversion layer configured to absorb radiation at a first wavelength incident on the transmissive plate and reradiate radiation at a second wavelength, the quantum conversion layer arranged on a side of the transmissive plate opposite the side facing the projection system;
 a fiber optics block comprising a plurality of optical fibers; and
 a radiation detector, wherein the plurality of optical fibers is configured to guide radiation reradiated by the quantum conversion layer towards the radiation detector,
 wherein the fiber optics block is connected to the quantum conversion layer and separable from the radiation detector so as to be spaced away from the radiation detector.

2. A lithographic apparatus according to claim 1, wherein the substrate-level sensor further comprises a pressure-producing device configured to apply a pre-stressed force on the radiation detector such that the transmissive plate, the quantum conversion layer, the fiber optics block and the radiation detector are in contact with each other.

3. A lithographic apparatus according to claim 2, wherein the pressure-producing device comprises a spring.

4. A lithographic apparatus according to claim 1, wherein the quantum conversion layer comprises a material from the group comprising luminescent glass and/or phosphor.

5. A lithographic apparatus according to claim 1, wherein the quantum conversion layer has a thickness of at least five times larger than an absorption length in the quantum conversion layer of radiation of the first wavelength and at least 50 times smaller than the thickness of the transmissive plate.

6. A lithographic apparatus according to claim 1, wherein the quantum conversion layer at a first side is connected to the fiber optics block with an optical glue.

7. A lithographic apparatus according to claim 6, wherein the quantum conversion layer at a second side is connected to the transmissive plate with a contact established by direct contacting.

8. A lithographic apparatus according to claim 1, wherein the radiation receiver comprises at least a shearing grating and/or a pinhole.

9. A device manufacturing method, comprising:
projecting a pattern from a patterning device onto a substrate using a projection system; and
measuring lens aberrations of the projection system using
 a substrate-level sensor comprising
 a radiation receiver positioned in a focal plane of a final element of the projection system;
 a transmissive plate configured to support the radiation receiver at a side facing the projection system;
 a quantum conversion layer configured to absorb radiation at a first wavelength incident on the transmissive plate and reradiate radiation at a second wavelength, the quantum conversion layer arranged on a side of the transmissive plate opposite the side facing the projection system;
 a fiber optics block comprising a plurality of optical fibers; and
 a radiation detector, wherein the plurality of optical fibers is configured to guide radiation reradiated by the quantum conversion layer towards the radiation detector,
 wherein the fiber optics block is connected to the quantum conversion layer and separable from the radiation detector so as to be spaced away from the radiation detector.

10. A radiation sensor, comprising:
a radiation receiver configured to receive incident radiation;
a transmissive plate configured to support the radiation receiver at a first side;
a quantum conversion layer configured to absorb radiation at a first wavelength incident on the transmissive plate and reradiate radiation at a second wavelength, the quantum conversion layer arranged on a side of the transmissive plate opposite the side facing the projection system;
a fiber optics block comprising a plurality of optical fibers configured to collect and guide radiation reradiated by the quantum conversion layer; and
a radiation detector configured to receive radiation guided by the plurality of optical fibers,
wherein the fiber optics block is connected to the quantum conversion layer and separable from the radiation detector so as to be spaced away from the radiation detector.

11. A radiation sensor according to claim 10, wherein the radiation sensor further comprises a pressure-producing device arranged to apply a pre-stressed force on the radiation detector such that the transmissive plate, the quantum conversion layer, the fiber optics block and the radiation detector are in contact with each other.

12. A radiation sensor according to claim 11, wherein the pressure-producing device comprises a spring.

13. A radiation sensor according to claim 10, wherein the quantum conversion layer comprises a material from the group comprising luminescent glass and/or phosphor.

14. A radiation sensor according to claim 10, wherein the quantum conversion layer has a thickness at least five times larger than an absorption length in the quantum conversion layer of radiation of the first wavelength and at least 50 times smaller than the thickness of the transmissive plate.

15. A radiation sensor according to claim 10, wherein the quantum conversion layer at a first side is connected to the fiber optics block with an optical glue.

16. A radiation sensor according to claim 15, wherein the quantum conversion layer at a second side is connected to the transmissive plate with a contact established by direct contacting.

17. A radiation sensor according to claim 10, wherein the radiation receiver comprises at least a shearing grating and/or a pinhole.

18. A lithographic apparatus, comprising:
a support configured to support a patterning device, the patterning device configured to provide a radiation beam at a first wavelength with a pattern in the cross-section of the radiation beam to form a patterned radiation beam;
a substrate table configured to hold a substrate;
a projection system configured to project the patterned radiation beam onto a target portion of the substrate; and
a radiation sensor comprising
 a radiation receiver configured to receive incident radiation;

a transmissive plate configured to support the radiation receiver at a first side;

a quantum conversion layer configured to absorb radiation at a first wavelength incident on the transmissive plate and reradiate radiation at a second wavelength;

a fiber optics block comprising a plurality of optical fibers configured to collect and guide radiation reradiated by the quantum conversion layer; and a radiation detector configured to receive radiation guided by the plurality of optical fibers, wherein the fiber optics block includes an absorbing material separate from, and arranged between, the fibers, the absorbing material configured to substantially absorb the reradiated radiation that falls outside a numerical aperture of the fiber optics block.

19. A device manufacturing method, comprising:

providing a radiation beam using an illumination system;

patterning the radiation beam;

projecting the patterned beam onto a target portion of a substrate; and measuring properties of the illumination system using a radiation sensor comprising a radiation receiver configured to receive incident radiation;

a transmissive plate configured to support the radiation receiver at a first side;

a quantum conversion layer configured to absorb radiation at a first wavelength incident on the transmissive plate and reradiate radiation at a second wavelength;

a fiber optics block comprising a plurality of optical fibers configured to collect and guide radiation reradiated by the quantum conversion layer; and a radiation detector configured to receive radiation guided by the plurality of optical fibers, wherein the fiber optics block includes an absorbing material separate from, and arranged between, the fibers, the absorbing material configured to substantially absorb the reradiated radiation that falls outside a numerical aperture of the fiber optics block.

20. A method of manufacturing a radiation sensor, the method comprising:

forming a structure by connecting a fiber optics block comprising a plurality of optical fibers with a block of quantum conversion material, the structure having a first end arranged for connection with the plurality of optical fibers and a second end arranged for connection with the quantum conversion material;

reducing the volume of the structure at the second end to form a fiber optics block provided with a quantum conversion layer;

connecting a transmissive plate with the second end of the structure;

positioning a radiation detector adjacent the first end of the structure, wherein the fiber optics block includes an absorbing material separate from, and arranged between, the fibers, the absorbing material configured to substantially absorb the reradiated radiation that falls outside a numerical aperture of the fiber optics block.

21. A method according to claim 20, wherein positioning the radiation detector comprises pressing the radiation detector against the first end of the structure.

22. A method according to claim 20, wherein positioning of the radiation detector comprises connecting the radiation detector to the first end of the structure.

23. A method according to claim 20, wherein reducing the volume of the structure at the second end is performed by mechanical and/or chemical polishing.

24. A method according to claim 20, wherein connecting the transmissive plate with the second end of the structure is performed by direct contacting.

25. A lithographic apparatus according to claim 1, wherein the fiber optics block includes an absorbing material separate from, and arranged between, the fibers, the absorbing material configured to substantially absorb the reradiated radiation that falls outside a numerical aperture of the fiber optics block.

* * * * *